(12) United States Patent
Miao et al.

(10) Patent No.: US 9,418,733 B2
(45) Date of Patent: Aug. 16, 2016

(54) JOINT SHORT-TIME AND LONG-TIME STORAGE DEVICE AND STORAGE METHOD THEREOF

(71) Applicant: Huazhong University of Science and Technology, Wuhan (CN)

(72) Inventors: Xiangshui Miao, Wuhan (CN); Yi Li, Wuhan (CN); Yingpeng Zhong, Wuhan (CN); Lei Xu, Wuhan (CN); Huajun Sun, Wuhan (CN); Xiaohua Xu, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 0 days.

(21) Appl. No.: 14/800,693

(22) Filed: Jul. 15, 2015

(65) Prior Publication Data

US 2015/0318040 A1    Nov. 5, 2015

Related U.S. Application Data

(63) Continuation-in-part of application No. PCT/CN2013/071157, filed on Jan. 30, 2013.

(30) Foreign Application Priority Data

Jan. 16, 2013   (CN) .......................... 2013 1 0015283

(51) Int. Cl.
| | | |
|---|---|---|
| *G11C 11/00* | (2006.01) | |
| *G11C 13/00* | (2006.01) | |
| *H01L 45/00* | (2006.01) | |
| *G11C 14/00* | (2006.01) | |
| *G11C 11/54* | (2006.01) | |

(52) U.S. Cl.
CPC ........ *G11C 13/0004* (2013.01); *G11C 13/0002* (2013.01); *G11C 13/0011* (2013.01); *G11C 13/0033* (2013.01); *G11C 13/0035* (2013.01); *G11C 13/0069* (2013.01); *G11C 13/0097* (2013.01); *G11C 14/00* (2013.01); *H01L 45/06* (2013.01); *H01L 45/085* (2013.01); *H01L 45/1233* (2013.01); *H01L 45/1253* (2013.01); *H01L 45/142* (2013.01); *H01L 45/143* (2013.01); *H01L 45/144* (2013.01); *G11C 11/54* (2013.01); *G11C 2013/0092* (2013.01)

(58) Field of Classification Search
USPC ......................................... 365/163, 148, 174
See application file for complete search history.

(56) References Cited

U.S. PATENT DOCUMENTS

| | | | | |
|---|---|---|---|---|
| 2013/0134383 A1* | 5/2013 | Hwang | .................... | H01L 45/16 257/5 |
| 2013/0175494 A1* | 7/2013 | Collins | ................. | H01L 45/085 257/4 |
| 2014/0293678 A1* | 10/2014 | Orlowski | ................ | H01L 45/08 365/148 |

* cited by examiner

*Primary Examiner* — Vu Le

(74) *Attorney, Agent, or Firm* — Matthias Scholl, PC; Matthias Scholl

(57) ABSTRACT

A joint short-time and long-time storage device, including a first electrode layer, a functional material layer connected to the first electrode layer, and a second electrode layer connected to the functional material layer. The first electrode layer is made of inert conductive metal, the second electrode layer is made of active conductive metal, and the functional material layer is made of chalcogenide.

18 Claims, 4 Drawing Sheets

JOINT SHORT-TIME AND LONG-TIME STORAGE DEVICE AND STORAGE METHOD THEREOF

CROSS-REFERENCE TO RELATED APPLICATIONS

This application is a continuation-in-part of International Patent Application No. PCT/CN2013/071157 with an international filing date of Jan. 30, 2013, designating the United States, now pending, and further claims priority benefits to Chinese Patent Application No. 201310015283.2 filed Jan. 16, 2013. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND OF THE INVENTION

1. Field of the Invention

The invention relates to a joint short-time and long-time storage device and a storage method thereof.

2. Description of the Related Art

Conventional memories are divided into two categories. The first category is non-volatile memory, such as, disc memory and flash memory, and the second category is volatile memory, such as, Dynamic Random-Access Memory (DRAM).

Conventionally, memories have been improved by increasing the storage density through decreasing the cell area. However, further improvement is difficult to achieve by the conventional method as the physical limit is being approached.

Typically, a storage memory contains only a long-time storage module and does not have the function of a short-time memory.

SUMMARY OF THE INVENTION

In view of the above-mentioned problems, it is an objective of the invention to provide a joint short-time and long-time storage device being able to realize long-time memory and short-time memory simultaneously.

To achieve the above objective, according to one embodiment of the invention, there is provided a joint short-time and long-time storage device, comprising a first electrode layer, a functional material layer connected to the first electrode layer, and a second electrode layer connected to the functional material layer, the first electrode layer is made of inert conductive metal, the second electrode layer is made of active conductive metal, and the functional material layer is made of chalcogenide.

In a class of this embodiment, the first electrode layer is configured to receive external pulse signals, the second electrode layer is configured to receive external pulse signals, when voltage applied between the first electrode layer and the second electrode layer equals a first write pulse, the storage device switches from a high impedance state to a volatile low impedance state and recovers from the volatile low impedance state to the high impedance state after a forgetting time thereby enabling short-time storage, and when voltage applied between the first electrode layer and the second electrode layer equals a second write pulse, the storage device switches from a high impedance state to a non-volatile low impedance state thereby enabling long-time storage.

In a class of this embodiment, the first electrode layer is configured to receive external pulse signals, the second electrode layer is configured to receive external pulse signals, when voltage applied between the first electrode layer and the second electrode layer equals multiple first write pulses spaced with a first time interval, the storage device switches from the high impedance state to the volatile low impedance state and recovers from the volatile low impedance state to the high impedance state after a forgetting time thereby enabling short-time storage, when voltage applied between the first electrode layer and the second electrode layer equals multiple first write pulses spaced with a second time interval, the storage device switches from the high impedance state to the non-volatile low impedance state thereby enabling long-time storage, and the second time interval is shorter than the first time interval.

In a class of this embodiment, the first electrode layer is configured to receive external pulse signals, the second electrode layer is configured to receive external pulse signals, and when voltage applied between the first electrode layer and the second electrode layer equals a reset pulse, the storage device recovers from the volatile low impedance state or the non-volatile low impedance state to the high impedance state thereby enabling a reset function.

In a class of this embodiment, a voltage amplitude of the first write pulse is higher than a first voltage threshold and lower than a second voltage threshold, a voltage amplitude of the second write pulse is higher than the second voltage threshold, the first time interval is longer than a time threshold, and the second time interval is shorter than the time threshold.

In a class of this embodiment, the first voltage threshold is 0.5-1.5V, the second voltage threshold is 1.6-3V, and the time threshold is 1 ms-168 h.

In a class of this embodiment, the first electrode layer, the functional material layer and the second electrode layer forms a laminated sandwich structure, a T-shaped structure, an I-shaped structure or a pyramid structure.

In a class of this embodiment, the first electrode layer is made of Pt, TiW or Ta.

In a class of this embodiment, the functional material layer is made of alloy formed by any two or more of Ge, Sb, Te, Sn, Se and Bi.

In a class of this embodiment, the second electrode layer is made of Ag or Cu.

According to another embodiment of the invention, there is provided a joint short-time and long-time storage method, comprising steps of:

1) applying a pulse signal between a first electrode layer and a second electrode layer;

2) controlling voltage between the first electrode layer and the second electrode layer to equal a first write pulse so that a storage device switches from a high impedance state to a volatile low impedance state and recovers from the volatile low impedance state to the high impedance state after a forgetting time, thereby enabling short-time storage; and 3) controlling voltage between the first electrode layer and the second electrode layer to equal a second write pulse so that the storage device switches from the high impedance state to a non-volatile low impedance state, thereby enabling long-time storage.

In a class of this embodiment, the storage method further comprises steps of:

4) controlling voltage between the first electrode layer and the second electrode layer to equal multiple first write pulses spaced with a first time interval so that the storage device switches from the high impedance state to the volatile low impedance state and recovers from the volatile low impedance state to the high impedance state after the forgetting time, thereby enabling short-time storage; and 5) controlling voltage between the first electrode layer and the second electrode layer to equal multiple first write pulses spaced with a second time interval so that the storage device switches from the high impedance state to the non-volatile low impedance state, thereby enabling long-time storage, the second time interval being shorter than the first time interval.

In a class of this embodiment, the storage method further comprises controlling voltage between the first electrode layer and the second electrode layer to equal a reset pulse so that the storage device recovers from the volatile low impedance state or the non-volatile low impedance state to the high impedance state, thereby enabling a reset function.

In the invention, under the effect of a single first write signal or multiple first write pulses spaced with a first time interval, the storage device switches from a high impedance state to a volatile low impedance state, and storage information can be maintained for a short period of time. Under the effect of a single second write pulse or multiple first write pulses spaced with a second time interval, the storage device switches from the high impedance state or the volatile low impedance state to a non-volatile low impedance state, and the storage information can be maintained for a long period of time. By means of the invention, functional simulation of biological short-time memory and long-time memory can be realized, important data is stably stored for a long time, and unimportant data is actively forgotten and deleted, and therefore, the storage efficiency is improved from the function.

DETAILED DESCRIPTION OF THE EMBODIMENTS

Figure 1:
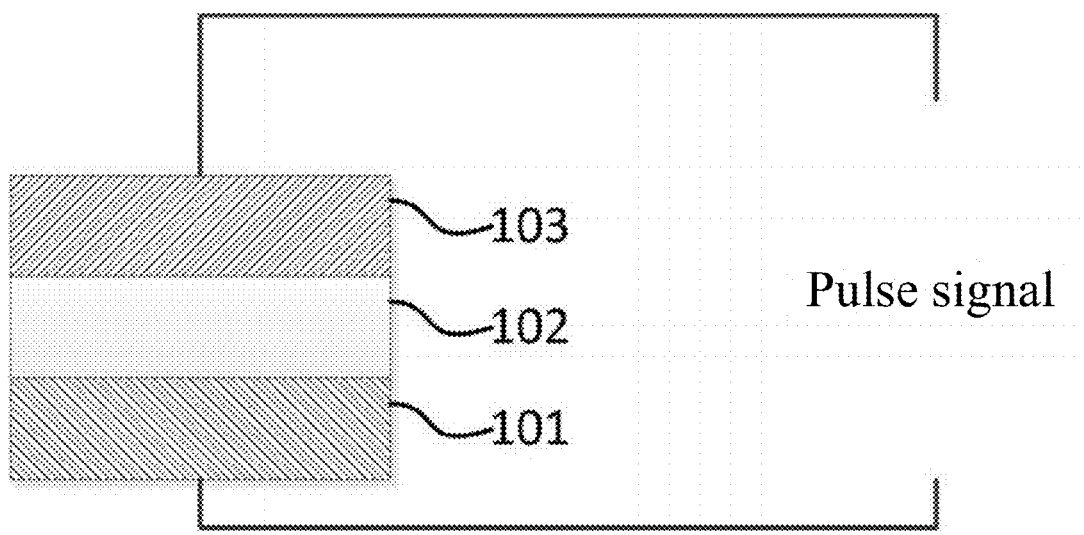
FIG. 1 is a schematic diagram of a joint short-time and long-time storage device according to one embodiment of the invention.

For clear understanding of the objectives, features and advantages of the invention, detailed description of the invention will be given below in conjunction with accompanying drawings and specific embodiments. It should be noted that the embodiments are only meant to explain the invention, and not to limit the scope of the invention.

The invention provides a new storage device and a storage method thereof. The device can store information both for a short period of time and for a long period of time, which can be used to simulate information storage mode of a human brain to combine short-time memory with long-time memory and is a possible resolution for improving efficiency of present storage devices.

Preferably, a joint short-time and long-time storage device comprises a first electrode layer, a functional material layer connected to the first electrode layer, and a second electrode layer connected to the functional material layer. The first electrode layer is made of inert conductive metal, the second electrode layer is made of active conductive metal, and the functional material layer is made of chalcogenide. The storage device can simulate short-time memory and long-time memory of a human brain to realize joint short-time and long-time information storage. It features low power consumption, small size down to nano scale and simple structure with two terminals, and use chalcogenide as functional material which is easy to produce with low cost and has been mature enough to be used in the information storage industry. Therefore, the device is applicable for large-scale storage arrays or neural network arrays.

Preferably, the first electrode layer is configured to receive external pulse signals, the second electrode layer is configured to receive external pulse signals, when voltage applied between the first electrode layer and the second electrode layer equals a first write pulse, the storage device switches from a high impedance state to a volatile low impedance state and recovers from the volatile low impedance state to the high impedance state after a forgetting time thereby enabling short-time storage, and when voltage applied between the first electrode layer and the second electrode layer equals a second write pulse, the storage device switches from a high impedance state to a non-volatile low impedance state thereby enabling long-time storage.

Preferably, the first electrode layer is configured to receive external pulse signals, the second electrode layer is configured to receive external pulse signals, when voltage applied between the first electrode layer and the second electrode layer equals multiple first write pulses spaced with a first time interval, the storage device switches from the high impedance state to the volatile low impedance state and recovers from the volatile low impedance state to the high impedance state after a forgetting time thereby enabling short-time storage, when voltage applied between the first electrode layer and the second electrode layer equals multiple first write pulses spaced with a second time interval, the storage device switches from the high impedance state to the non-volatile low impedance state thereby enabling long-time storage, and the second time interval is shorter than the first time interval. The forgetting time is 5 ms-168 h, which changes with the materials.

Preferably, the first electrode layer is configured to receive external pulse signals, the second electrode layer is configured to receive external pulse signals, and when voltage applied between the first electrode layer and the second electrode layer equals a reset pulse, the storage device recovers from the volatile low impedance state or the non-volatile low impedance state to the high impedance state thereby enabling a reset function.

Preferably, the storage device can simulate short-time memory and long-time memory of a human brain, which comprises: (1) the storage device has at least three impedance states which are high-impedance state (OFF state), low-impedance state with a comparatively short maintaining time (volatile low-impedance state for short-time storage), and stably maintained low-impedance state (non-volatile low-impedance state for long-time storage); (2) applying a first write pulse, the storage device switches from the OFF state to the volatile low-impedance state and recovers from the volatile low-impedance state to the OFF state automatically in the following period to realize short-time memory; (3) applying multiple first write pulses with enough long intervals, the storage device switches from the OFF state to the volatile low-impedance state and recovers from the volatile low-impedance state to the OFF state automatically in the following period to realize short-time memory; (4) applying multiple first write pulses with enough short intervals, the storage device switches from the OFF state to the non-volatile low-impedance state to realize long-time memory; (5) applying a reset pulse, the storage device recovers from the volatile low-impedance state for short-time memory or the non-volatile low-impedance state for long-time memory to the OFF state. Implementations are illustrated specifically by embodiments. Preferably, functional simulation of biological short-time memory and long-time memory can be realized by the joint short-time and long-time storage device, important data is stably stored for a long time, and unimportant data is actively forgotten and deleted, and therefore, the storage efficiency is improved from the function.

Preferably, the joint short-time and long-time storage device has a structure of active electrode/amorphous chalcogenide material/inert electrode. The functional material layer is made of chalcogenide, one electrode is made of active metal such as Ag or Cu, and the other electrode is made of inert metal such as Pt, Au, Ti, TiN, TiW or Ta. Impedance change of the device is based on two different mechanisms. One is based on oxidation reaction at interface of a metal electrode and the chalcogenide generating active metal ions entering the chalcogenide and migrating therein under the effect of electric field to form metal conductive lines to reduce the impedance. The metal conductive lines tend to break over time resulting in increasing impedance to realize short-time memory. The other is based on phase change in the chalcogenide under the effect of Joule heat generated by the current which switches from the amorphous state of high impedance to the crystalline state of low impedance to realize long-time memory.

The device is at the OFF state of high impedance originally. Applying a write pulse, oxidation reaction occurs at interface of the second electrode and the functional material to generate metal ions of the material thereof, which move towards the first electrode whereby forming metal conductive lines in the functional material between the first electrode and the second electrode, phase change of the functional material is not induced, and the device switches to the volatile low-impedance state based on conduction of the metal conductive lines to realize short-time storage. Continuing applying the write pulse, phase change of the functional material occurs due to energy accumulation of the chalcogenide, which switches to the stable crystalline state of low impedance, and the device is at the non-volatile low-impedance state at the time thereby enabling long-time storage. The device is at the OFF state of high impedance originally. Applying a write pulse with comparatively great amplitude, phase change of the functional material occurs and the device switches to the non-volatile low-impedance state thereby enabling long-time storage. The device is at the ON state of low-impedance, applying a negative reset pulse, metal ions in the functional material move towards the second electrode resulting in break of metal lines connecting the first electrode and the second electrode, phase change of the functional material reoccur which switches to the stable amorphous state of high impedance, and the device is reset to the OFF state of high-impedance state. Besides, the metal lines spread in the functional material under the effect of external circumstance and break after a period of time, and the device recovers to the OFF state of high impedance.

Preferably, the first electrode is made of inert conductive metal such as Pt, TiW or Ta, the second electrode is made of active conductive metal such as Ag or Cu, and the functional material is made of chalcogenide formed by any two or more of Ge, Sb, Te and Bi such as GeTe, $Ge_2Sb_2Te_5$, $Sb_2Te_3$, BiTe or AgInSbTe.

Preferably, a voltage amplitude of the first write pulse is greater than a first voltage threshold and smaller than a second voltage threshold, a voltage amplitude of the second write pulse is greater than the second voltage threshold, the first time interval is longer than a time threshold, and the second time interval is shorter than the time threshold.

Preferably, the first electrode layer, the functional material layer and the second electrode layer forms a laminated sandwich structure, a T-shaped structure, an I-shaped structure or a pyramid structure. A joint short-time and long-time storage device with a laminated sandwich structure is shown in FIG. 1. Only elements related to the embodiment is illustrated for convenience.

The joint short-time and long-time storage device comprises a first electrode 101, a second electrode 103 and a functional material 102 between the first electrode 101 and the second electrode 103. The functional material 102 is connected to the first electrode 101 and the second electrode 103 electrically. In this embodiment, the first electrode is made of Pt, the second electrode is made of Ag, and the functional material is GeTe.

In the following test, a pulse voltage signal is applied to the second electrode 103, the first electrode 101 is grounded, and impedance of the device equals that between the first electrode 101 and the second electrode 103. Write pulse with voltage amplitude greater than the first voltage threshold (0.5-1.5 V) and smaller than the second voltage threshold (1.6-3 V) is defined as the first write pulse, write pulse with voltage amplitude greater than the second voltage threshold is defined as the second write pulse, interval of write pulses greater than the time threshold (1 ms-168 h) is defined as the first time interval, and interval of write pulses smaller than the time threshold is defined as the second time interval. The device is at high-impedance state (OFF state) when impedance thereof is greater than a first impedance threshold (50 kΩ-10 MΩ), and is at low-impedance state (ON state) when impedance thereof is smaller than a second impedance threshold (1 kΩ-50 kΩ).

Figure 2:
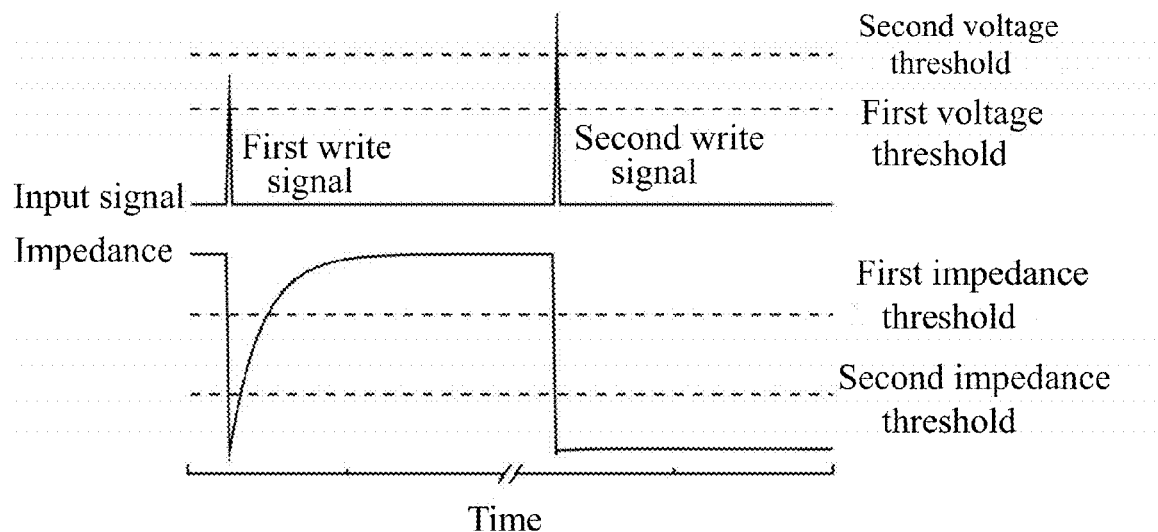
FIG. 2 is a test diagram simulating short-time memory and long-time memory of a human brain according to one embodiment of the invention.

Simulation of short-time memory and long-time memory of a human brain by the joint short-time and long-time storage device according to one embodiment of the invention is shown in FIG. 2.

The storage device is at the OFF state originally. Applying a first write pulse, impedance of the device reduces and the device switches to the volatile low-impedance state. The input signal turns to 0 afterwards, impedance of the device increases gradually and the device recovers to the OFF state after a period of time to realize short-time memory.

The storage device is at the OFF state originally. Applying a second write pulse, impedance of the device reduces and the device switches to the non-volatile low-impedance state. The input signal turns to 0 afterwards, impedance of the device remains unchanged approximately and the device stays at the ON state of low-impedance to realize long-time memory.

Figure 3:
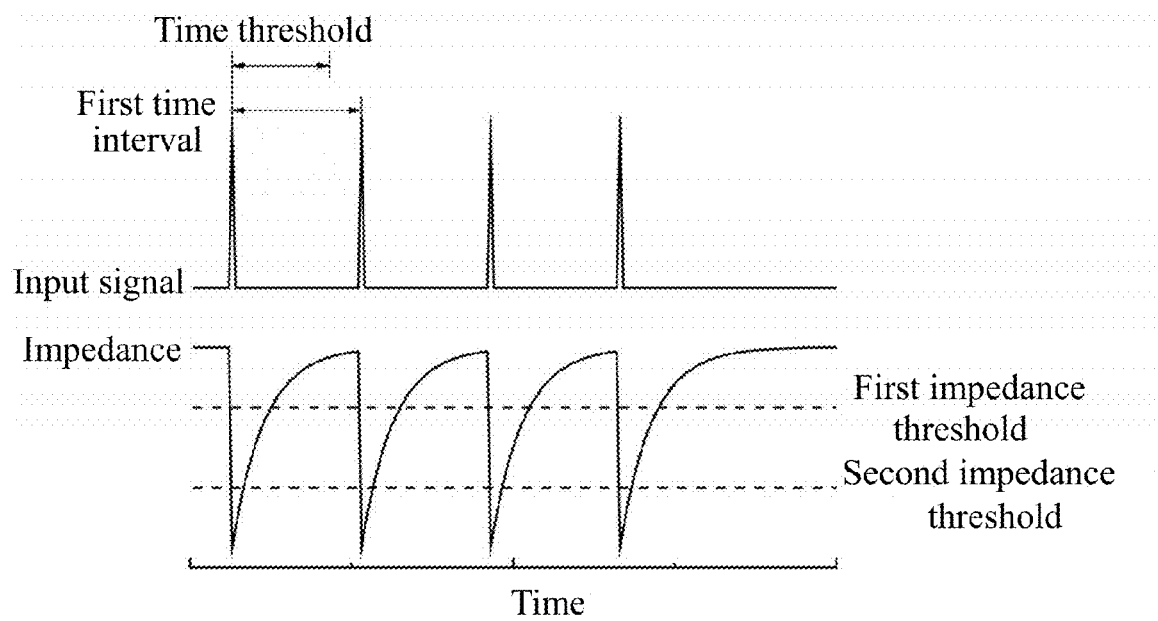
FIG. 3 is a test diagram simulating short-time memory of a human brain by the joint short-time and long-time storage device according to one embodiment of the invention.

Simulation of short-time memory of a human brain by the joint short-time and long-time storage device according to one embodiment of the invention is shown in FIG. 3.

The storage device is at the OFF state originally. Applying a first write pulse, impedance of the device reduces and the device switches to the volatile low-impedance state. When the input signal is 0, impedance of the device increases gradually and the device recovers to the OFF state after a period of time. After the first time interval, reapplying the first write pulse, impedance of the device reduces once again and the device switches to the volatile low-impedance state. When the input signal is 0, impedance of the device increases gradually once again and the device recovers to the OFF state after a period of time. Applying multiple first write pulses with the first time intervals, the device is able to recover to the OFF state after switching to the volatile low-impedance state.

Figure 4:
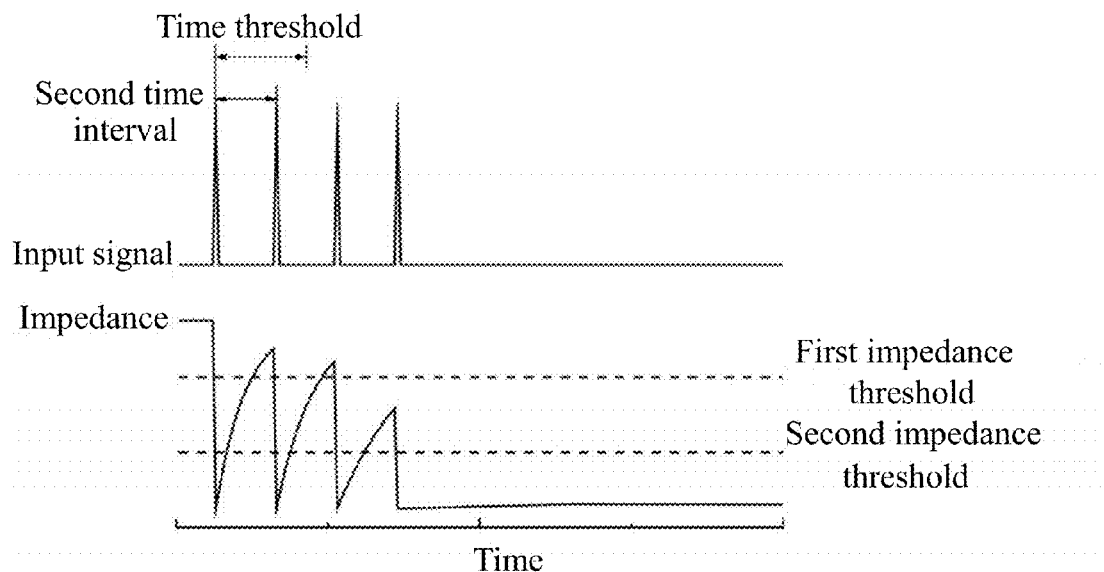
FIG. 4 is a test diagram simulating long-time memory of a human brain by the joint short-time and long-time storage device according to one embodiment of the invention.

Simulation of long-time memory of a human brain by the joint short-time and long-time storage device according to one embodiment of the invention is shown in FIG. 4.

The joint short-time and long-time storage device is at the OFF state originally. Applying a first write pulse, impedance of the device reduces and the device switches to the volatile low-impedance state. When the input signal is 0, impedance of the device increases gradually and the device recovers to the OFF state after a period of time. After the second time interval, reapplying the first write pulse, impedance of the device reduces once again and the device switches to the volatile low-impedance state. When the input signal is 0, impedance of the device increases gradually once again and the device recovers to the OFF state after a period of time. The device switches to the non-volatile low-impedance state after applying multiple first write pulses with the second time intervals.

Figure 5:
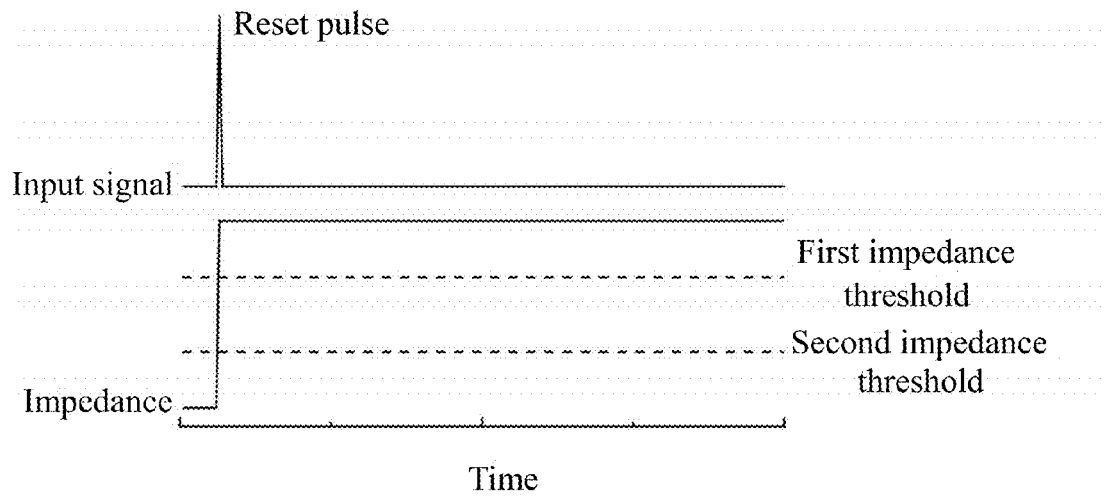
FIG. 5 is a test diagram simulating memory elimination of a human brain by the joint short-time and long-time storage device according to one embodiment of the invention.

Simulation of memory elimination (storage information erasure) of a human brain by the joint short-time and long-time storage device according to another embodiment of the invention is shown in FIG. 5.

The joint short-time and long-time storage device is at the ON state originally. Applying a negative reset pulse, impedance of the device increases and the device switches to the OFF state. When the input signal is 0, conductivity of the device remains the same approximately so that the device stays at the OFF state.

A storage method by the joint short-time and long-time storage device according to one embodiment of the invention comprises:

1) controlling voltage between the first electrode layer and the second electrode layer to equal a first write pulse so that a storage device switches from a high impedance state to a volatile low impedance state and recovers from the volatile low impedance state to the high impedance state after a forgetting time, thereby enabling short-time storage; and 2) controlling voltage between the first electrode layer and the second electrode layer to equal a second write pulse so that the storage device switches from the high impedance state to a non-volatile low impedance state, thereby enabling long-time storage.

Preferably, the method further comprises:

3) controlling voltage between the first electrode layer and the second electrode layer to equal multiple first write pulses spaced with a first time interval so that the storage device switches from the high impedance state to the volatile low impedance state and recovers from the volatile low impedance state to the high impedance state after the forgetting time, thereby enabling short-time storage; and 4) controlling voltage between the first electrode layer and the second electrode layer to equal multiple first write pulses spaced with a second time interval so that the storage device switches from the high impedance state to the non-volatile low impedance state, thereby enabling long-time storage, the second time interval being shorter than the first time interval.

Figure 6:
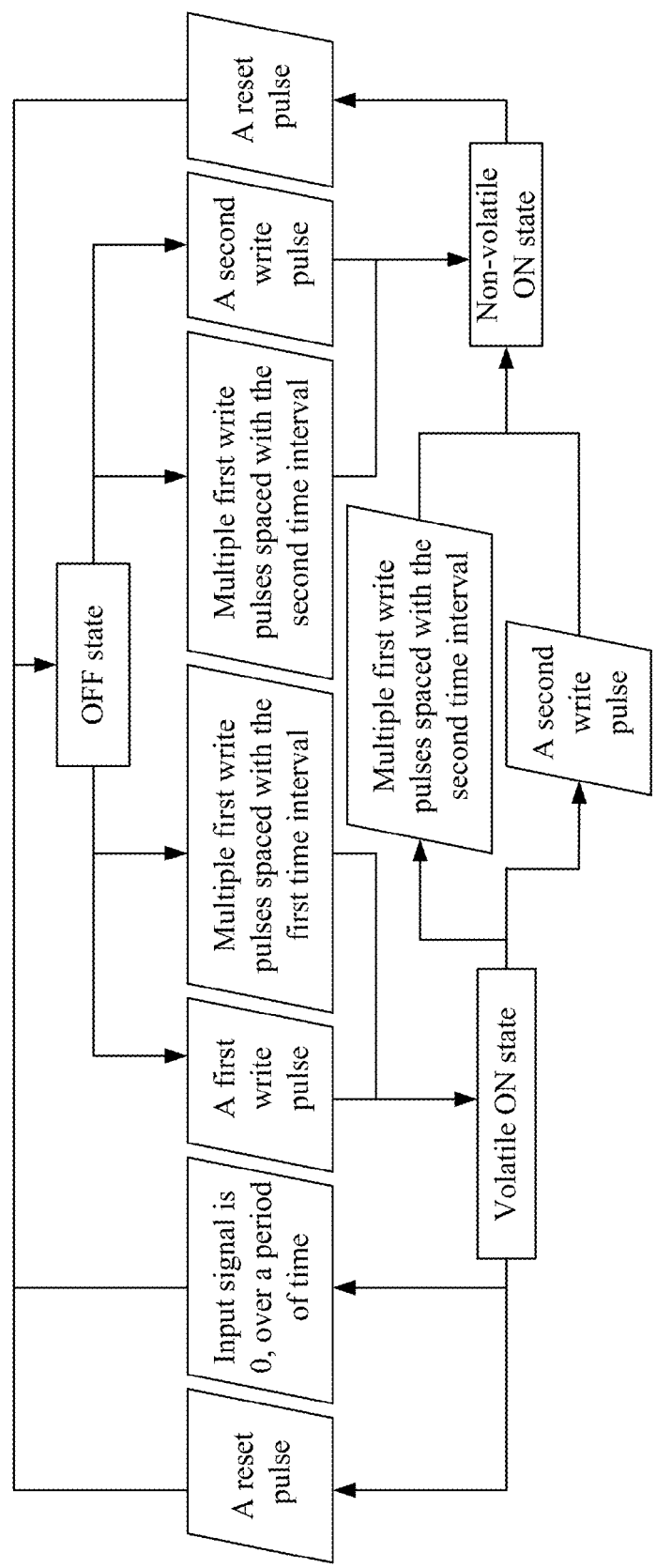
FIG. 6 is a flow chart of operating the joint short-time and long-time storage device according to one embodiment of the invention.

Preferably, the method further comprises: controlling voltage between the first electrode layer and the second electrode layer to equal a reset pulse so that the storage device recovers from the volatile low impedance state or the non-volatile low impedance state to the high impedance state, thereby enabling a reset function. A flow chart of the invention is shown in FIG. 6, short-time memory, long-time memory and storage information erasure are realized by the joint short-time and long-time storage device.

The joint short-time and long-time storage device is at the OFF state originally. Applying a first write pulse or multiple first write pulses with the first time intervals, the storage device switches to the volatile low-impedance state. Applying a second write pulse or multiple first write pulses with the second time intervals, the storage device switches to the non-volatile low-impedance state.

The joint short-time and long-time storage device is at the volatile low-impedance state originally. Applying no signal, the storage device switches to the OFF state after a period of time, or applying a reset signal, the storage device switches to the OFF state. Applying a second write pulse or multiple first write pulses with the second time intervals, the storage device switches to the non-volatile low-impedance state.

The joint short-time and long-time storage device is at the non-volatile low-impedance state originally. Applying the reset pulse, the storage device switches to the OFF state.

Preferably, a device of other structure (such as T-shaped structure, I-shaped structure or pyramid structure), with a first electrode of other material (inert conductive metal such as TiW or Ta), with a second electrode of other material (active conductive metal such as Cu), using other chalcogenide as functional material (alloy formed by any two or more of Ge, Sb, Te, Sn, Se and Bi such as GeTe, $Ge_2Sb_2Te_5$, $Sb_2Te_3$, BiTe or AgInSbTe) can also realize the above function of joint short-time and long-time storage and will not be illustrated herein.

The joint short-time and long-time storage device and the method thereof of the invention can simulate short-time memory, long-time memory and memory elimination of a human brain simultaneously.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A storage device, comprising: a first electrode layer, a functional material layer connected to the first electrode layer, and a second electrode layer connected to the functional material layer;

wherein:
  the first electrode layer is inert conductive metal;
  the second electrode layer is active conductive metal;
  the functional material layer is chalcogenide;
  the first electrode layer is configured to receive external pulse signals;
  the second electrode layer is configured to receive external pulse signals;
  when voltage applied between the first electrode layer and the second electrode layer equals a first write pulse, the storage device switches from a high impedance state to a volatile low impedance state and recovers from the volatile low impedance state to the high impedance state after a forgetting time thereby enabling short-time storage; and
  when voltage applied between the first electrode layer and the second electrode layer equals a second write pulse, the storage device switches from the high impedance state to the non-volatile low impedance state thereby enabling long-time storage.

2. The device of claim 1, wherein when voltage applied between the first electrode layer and the second electrode layer equals multiple first write pulses spaced with a first time interval, the storage device switches from the high impedance state to the volatile low impedance state and recovers from the volatile low impedance state to the high impedance state after a forgetting time thereby enabling short-time storage, when voltage applied between the first electrode layer and the second electrode layer equals multiple first write pulses spaced with a second time interval, the storage device switches from the high impedance state to the non-volatile low impedance state thereby enabling long-time storage, and the second time interval is shorter than the first time interval.

3. The device of claim 1, wherein when voltage applied between the first electrode layer and the second electrode layer equals a reset pulse, the storage device recovers from the volatile low impedance state or the non-volatile low impedance state to the high impedance state thereby enabling a reset function.

4. The device of claim 2, wherein when voltage applied between the first electrode layer and the second electrode layer equals a reset pulse, the storage device recovers from the volatile low impedance state or the non-volatile low impedance state to the high impedance state thereby enabling a reset function.

5. The device of claim 3, wherein a voltage amplitude of the first write pulse is higher than a first voltage threshold and lower than a second voltage threshold, a voltage amplitude of the second write pulse is higher than the second voltage threshold, the first time interval is longer than a time threshold, and the second time interval is shorter than the time threshold.

6. The device of claim 4, wherein a voltage amplitude of the first write pulse is higher than a first voltage threshold and lower than a second voltage threshold, a voltage amplitude of the second write pulse is higher than the second voltage threshold, the first time interval is longer than a time threshold, and the second time interval is shorter than the time threshold.

7. The device of claim 5, wherein the first voltage threshold is 0.5-1.5 V, the second voltage threshold is 1.6-3 V, and the time threshold is 1 ms-168 h.

8. The device of claim 6, wherein the first voltage threshold is 0.5-1.5 V, the second voltage threshold is 1.6-3 V, and the time threshold is 1 ms-168 h.

9. The device of claim 1, wherein the first electrode layer, the functional material layer, and the second electrode layer form a laminated sandwich structure, a T-shaped structure, an I-shaped structure or a pyramid structure.

10. The device of claim 7, wherein the first electrode layer, the functional material layer, and the second electrode layer form a laminated sandwich structure, a T-shaped structure, an I-shaped structure or a pyramid structure.

11. The device of claim 8, wherein the first electrode layer, the functional material layer, and the second electrode layer form a laminated sandwich structure, a T-shaped structure, an I-shaped structure or a pyramid structure.

12. The device of claim 1, wherein the first electrode layer is Pt, TiW or Ta.

13. The device of claim 1, wherein the functional material layer is alloy formed by any two or more of Ge, Sb, Te, Sn, Se and Bi.

14. The device of claim 1, wherein the second electrode layer is Ag or Cu.

15. A storage method, comprising:
1) applying a pulse signal between a first electrode layer and a second electrode layer;
2) controlling voltage between the first electrode layer and the second electrode layer to equal a first write pulse so that a storage device switches from a high impedance state to a volatile low impedance state and recovers from the volatile low impedance state to the high impedance state after a forgetting time, thereby enabling short-time storage; and
3) controlling voltage between the first electrode layer and the second electrode layer to equal a second write pulse so that the storage device switches from the high impedance state to a non-volatile low impedance state, thereby enabling long-time storage.

16. The method of claim 15, further comprising:
4) controlling voltage between the first electrode layer and the second electrode layer to equal multiple first write pulses spaced with a first time interval so that the storage device switches from the high impedance state to the volatile low impedance state and recovers from the volatile low impedance state to the high impedance state after the forgetting time, thereby enabling short-time storage; and
5) controlling voltage between the first electrode layer and the second electrode layer to equal multiple first write pulses spaced with a second time interval so that the storage device switches from the high impedance state to the non-volatile low impedance state, thereby enabling long-time storage, the second time interval being shorter than the first time interval.

17. The method of claim 15, further comprising: controlling voltage between the first electrode layer and the second electrode layer to equal a reset pulse so that the storage device recovers from the volatile low impedance state or the non-volatile low impedance state to the high impedance state, thereby enabling a reset function.

18. The method of claim 16, further comprising: controlling voltage between the first electrode layer and the second electrode layer to equal a reset pulse so that the storage device recovers from the volatile low impedance state or the non-volatile low impedance state to the high impedance state, thereby enabling a reset function.

* * * * *